US005810537A

United States Patent [19]

Briner et al.

[11] Patent Number: 5,810,537

[45] Date of Patent: Sep. 22, 1998

[54] ISOLATION CHAMBER TRANSFER APPARATUS

[75] Inventors: Donald R. Briner, Austin, Tex.; Christopher D. Laramore, San Jose, Calif.

[73] Assignee: Bye/Oasis Engineering Inc., Austin, Tex.

[21] Appl. No.: 733,951

[22] Filed: Oct. 18, 1996

Related U.S. Application Data

[60] Provisional application No. 60/005,353, Oct. 18, 1995.

[51] Int. Cl.[6] .................................................... B65G 49/07

[52] U.S. Cl. .......................... 414/217; 118/719; 414/940; 414/939; 414/937; 414/935; 414/416

[58] Field of Search .................................... 414/935, 937, 414/938, 939, 940, 416, 786, 417, 217, 222, 331; 118/719; 204/278.25

[56] References Cited

U.S. PATENT DOCUMENTS

| | | | |
|---|---|---|---|
| 4,619,572 | 10/1986 | Lorenzelli et al. | 414/217 |
| 4,859,137 | 8/1989 | Bonora et al. | 414/648 |
| 4,995,430 | 2/1991 | Bonora et al. | 141/98 |
| 5,024,329 | 6/1991 | Grohrock | 206/454 |
| 5,169,272 | 12/1992 | Bonora et al. | 414/217 |
| 5,291,923 | 3/1994 | Gallagher et al. | 141/98 |
| 5,295,522 | 3/1994 | DeAngelis et al. | 141/98 |
| 5,364,219 | 11/1994 | Takahashi et al. | 414/217 |
| 5,364,225 | 11/1994 | Hecht et al. | 414/786 |
| 5,370,491 | 12/1994 | Bonora et al. | 414/217 |
| 5,372,471 | 12/1994 | Wu | 414/786 |
| 5,377,476 | 1/1995 | Böhmer et al. | 53/255 |
| 5,382,127 | 1/1995 | Garric et al. | 414/217 |
| 5,388,945 | 2/1995 | Garric et al. | 414/217 |
| 5,391,035 | 2/1995 | Krueger | 414/217 |
| 5,713,711 | 2/1998 | McKenna et al. | 414/217 |

FOREIGN PATENT DOCUMENTS

| | | | |
|---|---|---|---|
| 338743 | 12/1993 | Japan | 414/940 |
| 13361 | 1/1994 | Japan | 414/939 |
| WO 93/18543 | 9/1993 | WIPO | 414/940 |

*Primary Examiner*—Frank E. Werner
*Attorney, Agent, or Firm*—Synnestvedt & Lechner

[57] ABSTRACT

An apparatus is provided for opening a Standardized Mechanical Interface transport box and facilitating access to the articles within the transport box by mechanisms inside a pressurized, isolated, controlled environment while maintaining isolated, controlled environment conditions, the apparatus comprising: a base for opening the transport box and supporting the box port and articles within, a platform for lifting the remainder of the transport box, a mechanism for lifting the platform, a flexible seal between the base and platform with devices for controlling contamination by use of the controlled environment pressurization and a pocket-style door providing isolation to the controlled environment when the transport box is either closed or not present. The apparatus further includes a base extender slidably movable into the controlled environment and devices for sensing mispositioned articles following return of the articles from the controlled environment to the base of the transport box.

17 Claims, 6 Drawing Sheets

22
42
26
36
38
40
16
12
18

38

40
46
33
48
44
32a
32b
16
14
18
71
12
66

20
40
48
16
18
12

36
20
40
64
16
80
48
63
18
62
44
82
12
44
66

20
76
80
62
44
66
76
64
18

20
76
62
76
82
12
66
44
18

COMPUTER
I/O
BOARD
49
52
POD LATCH
SOL VALVE
ON/LATCHED
70
BASE EXTEND
SOL VALVE
ON/EXTENDED
58
LIFT
SOL VALVE
ON/UP
88
WO POSITION
SOL VALVE
ON/IN
51
TOP LATCH
SOL VALVE
ON/UNLATCHED
PNEUMATIC CONTROL

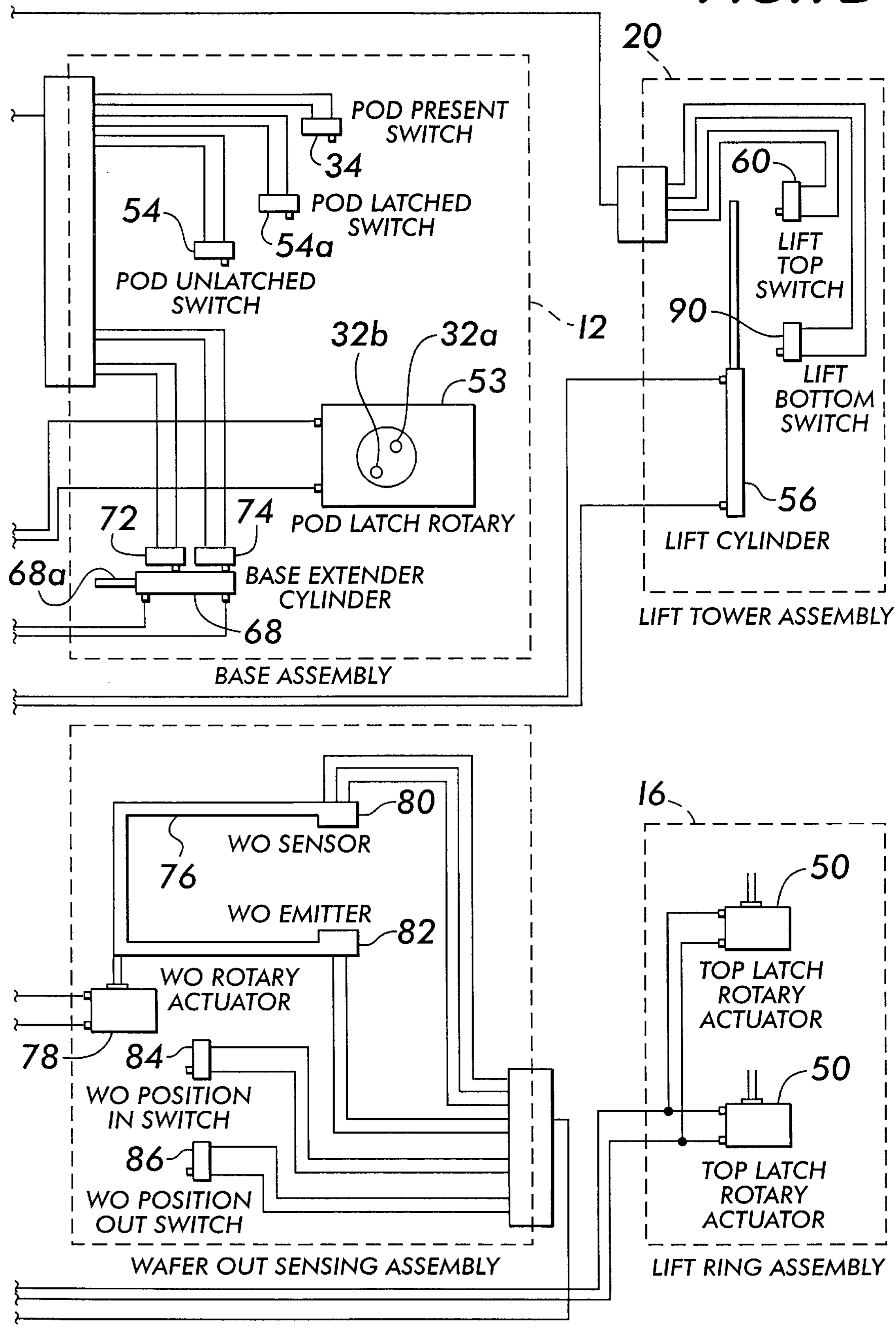
FIG. 7B
20
POD PRESENT SWITCH
34
54
POD LATCHED SWITCH
54a
POD UNLATCHED SWITCH
12
32b
32a
53
72
74
POD LATCH ROTARY
68a
BASE EXTENDER CYLINDER
68
BASE ASSEMBLY
60
LIFT TOP SWITCH
90
LIFT BOTTOM SWITCH
56
LIFT CYLINDER
LIFT TOWER ASSEMBLY
80
WO SENSOR
76
WO EMITTER
82
WO ROTARY ACTUATOR
78
84
WO POSITION IN SWITCH
86
WO POSITION OUT SWITCH
WAFER OUT SENSING ASSEMBLY
16
50
TOP LATCH ROTARY ACTUATOR
50
TOP LATCH ROTARY ACTUATOR
LIFT RING ASSEMBLY

ISOLATION CHAMBER TRANSFER APPARATUS

RELATED APPLICATIONS

This application is based on and claims the benefit of prior filed co-pending provisional application Ser. No. 60/005,353, filed Oct. 18, 1995.

FIELD OF THE INVENTION

The present invention relates to a manipulating apparatus, and while not intended to be limited thereto, the invention is particularly adapted for use with Standardized Mechanical Interface (SMIF) systems, and even more particularly to an apparatus for providing isolation of articles from contaminants during transfer into and out of a port opening in a SMIF system.

DESCRIPTION OF THE PRIOR ART

Integrated circuit and other electronic manufacturing requires extremely clean environments. Many electronic devices are fabricated on thin slices of semiconductor materials, such as silicon, commonly called wafers. Extremely fine circuits are patterned onto and into the wafer through a variety of process steps. During these steps, as well as during transport, staging and storage between steps, the wafers are very sensitive to particulate contamination by even very small particles of dust. This dust can interfere with the fabrication process or the electrical characteristics of the wafers and cause defects in the circuits. Since these defects have direct impact on the cost of fabrication, increasing the cleanliness of the manufacturing environment is extremely important to the increase in productivity of reliable circuit devices.

Fabrication of integrated circuits on wafers is accomplished by a series of process steps in different, particular pieces of equipment or tools. The wafer are normally transported between tools in holders (cassettes) that hold many wafers, typically 25, in parallel slots. Upon completion of one process step, the cassette of wafers is transported to the next for further processing.

The traditional method of contamination control has been to provide a clean room in which the manufacturing tools are housed. Special equipment filters and circulates filtered air through out the room. Personnel working in the clean room wear special clothing and adopt special procedures and precautions to reduce particulate contamination during the process and handling steps. The wafers are processed and transported between tools without leaving the clean room. There are, however, many disadvantages to the clean room. Clean rooms are expensive to build and maintain and are difficult to keep very clean because of the large volumes encompassed. Additionally, despite the special precautions, personnel working in a clean room are a constant source of contamination.

A revolutionary improvement in contamination control relevant to the clean room is the SMIF system that incorporates the concept of clean mini environments. A SMIF system is described in the article "SMIF: A TECHNOLOGY FOR WAFER CASSETTE TRANSFER IN VLSI MANUFACTURING" by Mihir Parikh and Ulrich Kaemph, *Solid State Technology*, July 1984, pp. 111–115. Each piece of equipment or tool is enclosed and isolated from the ambient within its own small clean environment. Inside this clean environment, wafers can be manipulated by automated handling systems or by personnel using clean glove ports to reach within. Additionally, the contamination sensitive wafers are also housed in a mini environment during all steps of processing and transport. The basic concept of the SMIF system is to provide the smallest possible volume of ultra-clean environment necessary for the sensitive wafers and isolate this volume from the ambient. The result is a system whereby superior cleanliness can be achieved. The cleanliness inside the system is independent of the ambient environment and the expense and inconvenience of a large clean room is eliminated.

A SMIF system is comprised of three main components:

(1) a contamination-free box or container for transporting and or storing a cassette of wafers. The SMIF box maintains a clean environment isolated from the ambient environment. The SMIF box also has features and mechanisms to facilitate ease of interface to the tool environments and to maintain a contamination free environment inside;

(2) a clean environment surrounding the wafer handling and other atmospheric processing portions of the process tool. This is typically provided by a pressurized enclosure around the tool that isolates and controls the environment at the portion of the tool that is sensitive to contamination; and (3) a mechanism whereby, with utmost cleanliness, the SMIF box is opened and the material within is either transferred outside the SMIF box or such transfer is facilitated. Isolation from contamination while merging the volumes of the SMIF box and tool controlled environment is accomplished by mating the door of the box with the door of the interface, thereby trapping contamination on the exterior portions of each door.

The SMIF system has been recognized by the Semiconductor Equipment and Materials International (SEMI) as an approach to interfacing a clean cassette transport box to a clean environmental housing on a piece of semiconductor processing equipment and has issued standards for the current 200 mm wafer size. This standard is published in SEMI specification E19.4-94.

While the present SMIF mechanisms have proved effective in providing extremely clean environments for fabricating ICs, improvements to the interface are needed to improve the system's utility and easily adapt to the tool's present method of wafer handling.

For more than a decade, high volume semiconductor wafer fabrication equipment has used standard cassettes for the transport of product through the fabrication facility. An understanding of the different types of mechanisms currently employed to transport wafers to and from cassettes is enlightening in that different types of SMIF mechanisms will have varying value in enabling both contamination control and ease of integration into existing wafer handling methods.

Methods of handling can be divided into three classes depending on the movement of the cassette relative to the host tool initiated by the host. In all cases, the cassette or groups of cassettes, both full and empty, are placed in specific locations on the tool. In the first class, the full movement class, the host can move the cassette with full freedom of motion in any direction and rotated on any axis. In the second class, the indexing elevator class, the cassette is moved up and down in the vertical Z-axis allowing the host mechanism to operate in a constant Z-plane to remove and place wafers in the slots of the cassette. In the third class, the vertical Z-axis pick-and-place class, the host never moves the cassette. The host mechanism has freedom of motion in the vertical Z-axis and picks or places the wafers directly into the cassette slots.

All three of these classes of wafer handling have merit and value depending on the specific processes and handling mechanisms employed by the host tool. Currently, there are SMIF mechanisms that are efficiently coupled with both the full motion and indexing elevator classes of after handling. Present SMIF mechanisms encompass two primary methods of extracting wafers from the box into the tool. The first method is by moving the entire cassette of wafers via a manual or automated manipulator from the top of the mated and opened box/interface doors into the tool where the wafers are dealt with by the tool's wafer handling system. The second method is an indexing method where the wafers are presented to the host tool for single wafer extraction from the cassette. In this case, the cassette remains seated on the mated box/interface doors as the doors are lowered into the tool mini environment and made accessible by the hosts single wafer handling mechanism.

SMIF mechanisms intended for indexing elevator classes of wafer handling when used for a vertical Z-axis pick-and-place class wafer handlers tend to force a tradeoff between SMIF box placement height and the host tools wafer handling area's height. If the box height is located at an ergonomically correct height for manual loading, then the equipment is forced to be shortened, thus inflicting ergonomic problems on maintenance functions, as well as reducing the volume under the wafer plane normally available for support electronics, mechanisms, etc. If the wafer plane is located conveniently for tool service and at a normal height, then the SMIF box placement is located out of ergonomic bounds for manual loading. The indexing feature of the elevator is also wasted on the vertical Z-axis pick-and-place class applications, as this feature is redundant with the indexing capabilities of the vertical Z-axis pick-and-place mechanism.

SMIF mechanisms intended for full movement classes of wafer handling when used for vertical Z-axis pick-and-place class wafer handler tend to be excessively complicated and expensive and in some cases exhibit the same ergonomic limitations as the misapplication of the indexing elevator class of SMIF mechanisms.

SUMMARY AND OBJECTS OF THE INVENTION

The present invention comprises an improved SMIF apparatus for enabling the transfer of contamination sensitive items, such as semiconductor wafers, during manufacture. In one of its simplest forms, the present invention comprises a base with the means to accept, sense and open a SMIF box; a lift ring with attachment means for securing the box top to the ring; a gate mechanism for isolating the controlled environment from the ambient; a lift mechanism with means for lifting the lift ring and box top relative to the base and mated box port; an expandable barrier expanded by operation of the lift mechanism with means for isolating the contamination sensitive items while maintaining utmost cleanliness. The invention advantageously facilitates the access to articles within the volume created by expansion of the expandable barrier by the host tool's vertical Z-axis article handling mechanism in a simple, compact fashion requiring minimal mechanical changes to the host tool. Means for sensing out position items prior to closure of the gate also are preferably provided.

With the foregoing in view, it is an important object of the present invention to provide a SMIF mechanism enabling a standard SEMI port located at a height that is essentially equal to the height of the placement of a cassette on a non-SMIFed tool. The present invention facilitates adoption of the SMIF concept and the related benefits inherent while maintaining the advantages of a wider range of host tool handling techniques.

Other objects and advantages of the invention will become apparent from the description of the preferred embodiment which follows.

DETAILED DESCRIPTION OF THE PREFERRED EMBODIMENT OF THE INVENTION

The preferred embodiment of the invention comprises method and apparatus for opening a box of the 200 mm SEMI Standard SMIF type and facilitating transport of contamination sensitive items between the SMIF box and a controlled environment housing an instrument used for processing of the contamination sensitive item. While not intending to limit the scope of application of the invention, in the description which follows, all references to SMIF boxes are intended to refer to boxes conforming to the above standard. Particular items handled in SMIF boxes are silicon wafers utilized in the manufacture semiconductor devices. As is well recognized in the art, these devices are highly sensitive to contamination by dust, aerosols and by other factors in the environment to which they may become exposed during processing.

Figure 1:
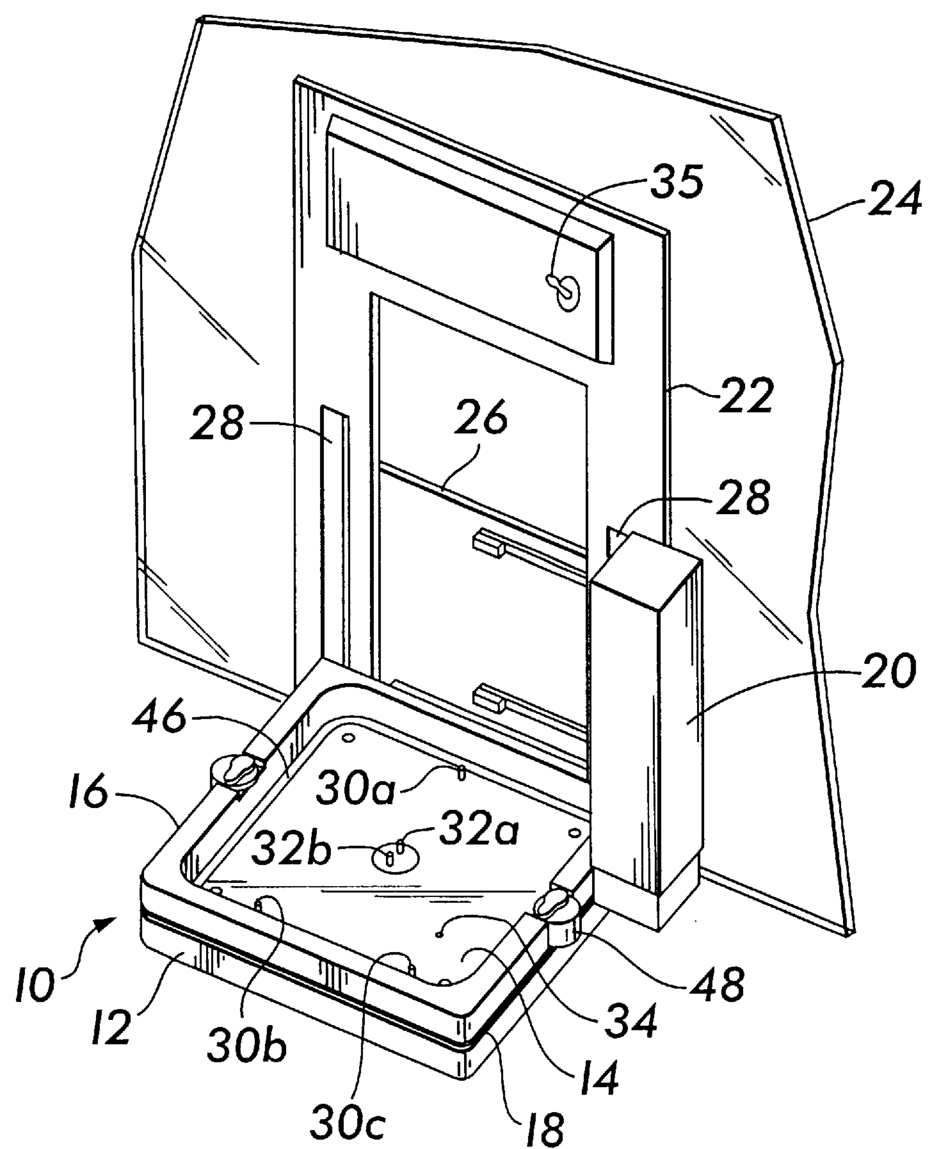
FIG. 1 is a three-quarter isometric view of an apparatus of the present invention.

FIG. 1 shows a preferred form of apparatus, generally indicated at 10, incorporating the principles of the present invention. The apparatus consists generally of a base plate 12 having an upper planar surface 14 mated with a lift frame or lift ring 16. The lift ring 16 is mounted for vertical movement relative to base plate 12 and is connected thereto along three sides thereof by an expandable isolator means 18, preferably in the form of a flexible bellows, best shown in FIGS. 2*a* and 3–6.

As will be understood from what follows, the function of the bellows is to provide an expandable space in which a clean environment is maintained during transfer of articles to and from the work station and the SMIF box. Accordingly, the bellows material should be capable of blocking particulate contaminates over a prolonged life span involving repeated cycling. PVC coated vinyl and GORTEX® materials have been found to produce excellent results, although a wide range of materials may be employed.

Alternatively to a bellows, a telescoping arrangement of a multiplicity of vertically slidable plates may be employed.

The apparatus further comprises a lift tower 20 which houses a lift mechanism described hereinafter for raising lift ring 16 and vertically expanding the flexible isolator means 18 relative to the base 12. The apparatus further comprises a vertically disposed bulkhead 22 which is intended to fit within an opening in wall 24 of a controlled environment work station of known type providing a micro-controlled environment for processing the articles transferred. A door 26 is mounted for vertical movement within a door pocket in bulkhead 22 for the purpose of sealing off the controlled environment when the apparatus of the invention is not in use. Preferably, there are small air gaps between the isolator and the surface of the bulkhead through which air at positive pressure from the work station flows, thereby ruling out contamination of articles during transfer. Similarly, the door has a slight air gap around its periphery, permits outward air flow and seals against contamination.

In the embodiment shown, three SMIF registration pins 30*a*, 30*b*, 30*c* project upwardly from the surface 14 of base 12 and interfit with standard openings in the lower surface of the base of a SMIF box for the purpose of proper alignment of the box with base plate 12. The base plate also is provided with a pair of latch actuating pins 32*a*, 32*b* which are mounted for rotation by a rotary actuator described hereinafter for the purpose of actuating a standard SMIF box actuator latching rod 33, shown in FIG. 2*a*. Rotation of pins 32*a*, 32*b* operates the latching rod 33 to free the base so that the SMIF box can be opened and closed. A box sense device 34 also is located in the upper surface of plate 12 for the purpose of sensing and sending a signal indicative of the proper placement of a SMIF box. A toggle switch 35, shown at the top of the bulkhead 22, is provided for turning on the apparatus.

In the following description, in describing the preferred form of apparatus and its mode of operation, reference also is made to FIGS. 2–7 and, in particular, to FIG. 7 which schematically illustrates the apparatus and its control system in overall form.

Figure 2:
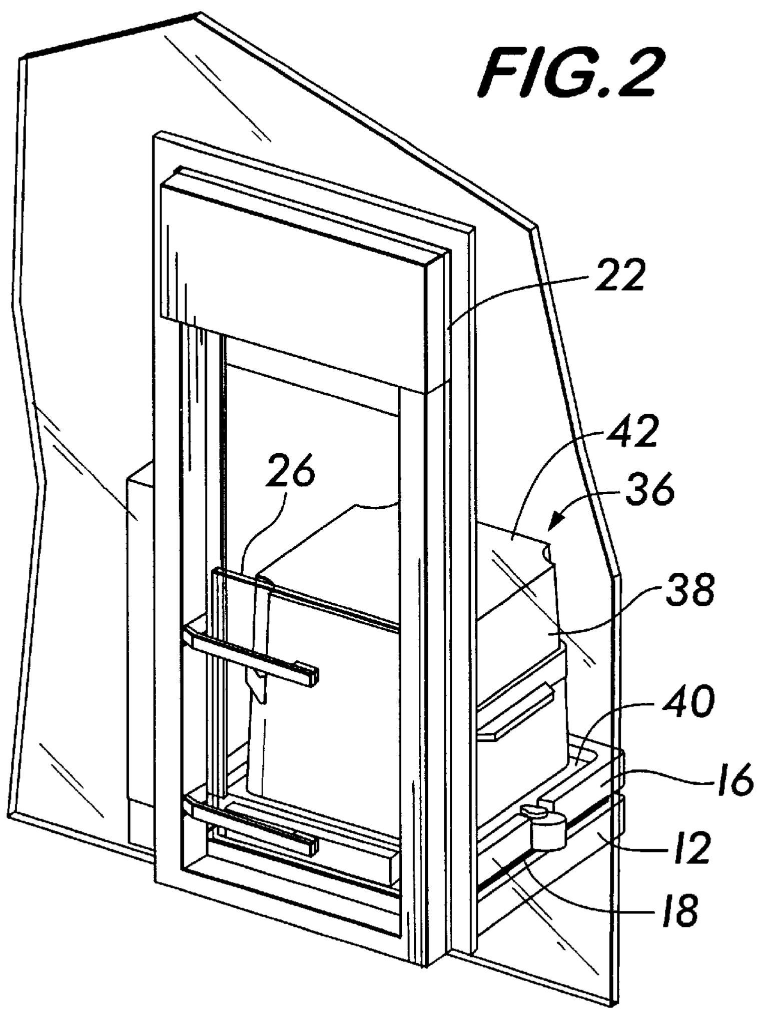
FIG. 2 is a one-quarter isometric view of an apparatus of FIG. 1 with an unopened SMIF box in place.
Figure 2A:
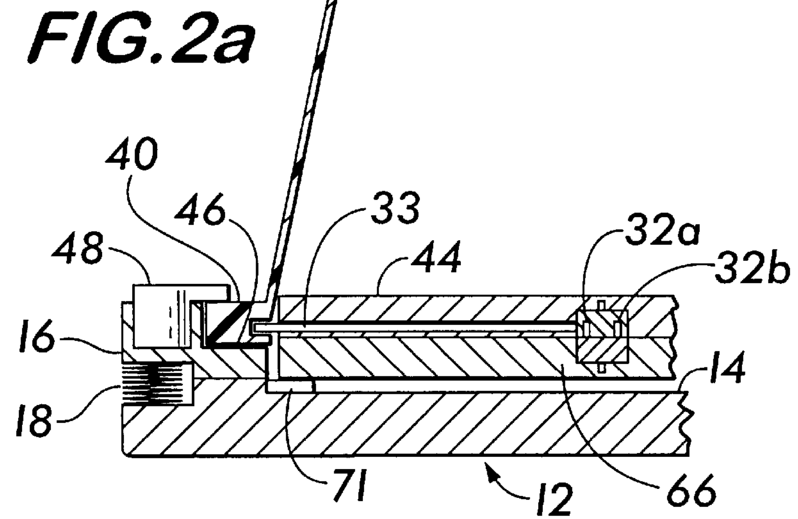
FIG. 2*a* is a fragmentary sectional view illustrating, in schematic form, the mounting of a SMIF box on the apparatus of the invention.

FIG. 2 illustrates the apparatus of the present invention looking from the rear of the apparatus with an unopened SMIF box 36 in place. The box 36 is formed of sidewalls 38 which have a flange 40 projecting from the base thereof, an integral top 42 and a separable base 44 (FIG. 2*a*). When the box is fitted within the pocket defined by the lift ring 16, flange 40 rests on a ledge 46 with the base 44 resting against the upper surface 14 of base plate 12.

Pneumaticly operated latches 48 are provided to secure the SMIF box sidewalls to the lift ring 16. Preferably, the latches 48 are rotatably mounted on the lift ring 16 and movable by rotary actuators 50, shown in FIG. 7, when the SMIF box sensor 34 indicates the presence of a box and toggle switch 35 is switched to the up position, as described more fully hereinafter. Although rotary latches 50 could be manually operated, they are preferably pneumatically controlled so as to rotate from the position, generally indicated in FIG. 1, to a position shown in FIGS. 3–6 wherein a projecting portion of each latch 48 rides over box flange 40.

With reference again to FIG. 7, SMIF box sensor 34 signals controller 49 which energizes top latch solenoid valve 51 to actuate rotary actuators 50 to rotate the latches to lock the upper portion of the box to the lift ring 16. A pod latch solenoid 52 is energized to rotate SMIF box latch rotary actuator 53, which rotates latch pins 32*a*, 32*b*, thereby opening standard latches internal to the SMIF box freeing the box bottom from the box top. A pod unlatch switch 54 on the pod or box latch rotary actuator 53 signals the controller 49 that this operation has been successfully completed.

Figure 3:
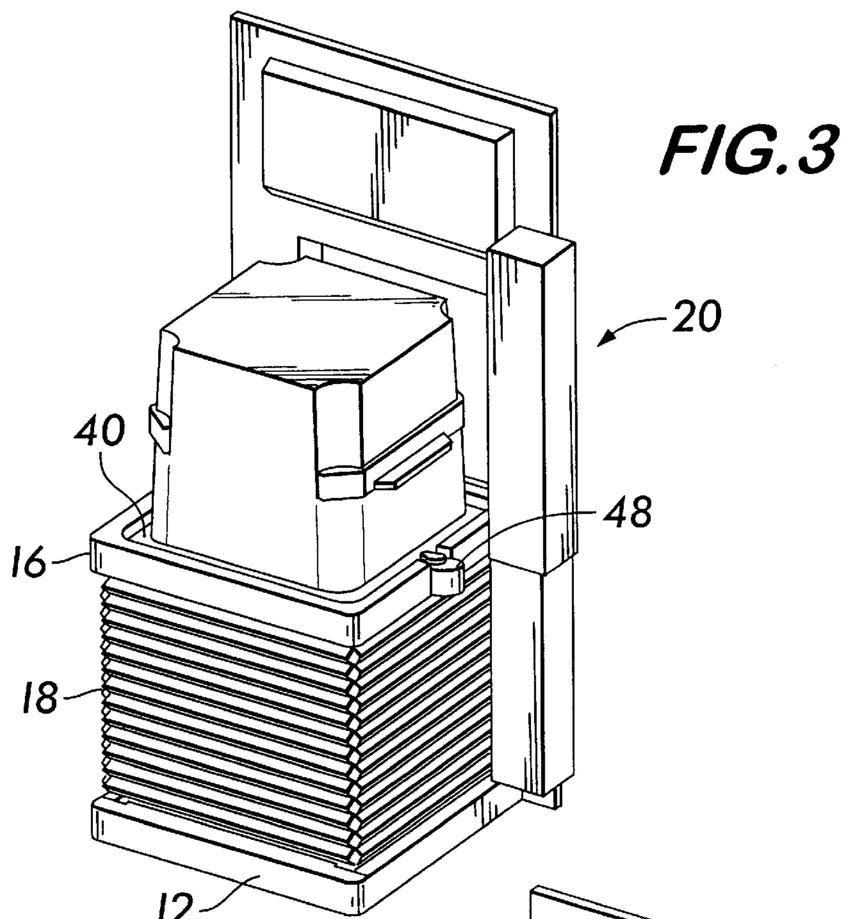
FIG. 3 is a three-quarter isometric view of an apparatus of FIG. 1 with an opened SMIF box in place.
Figure 4:
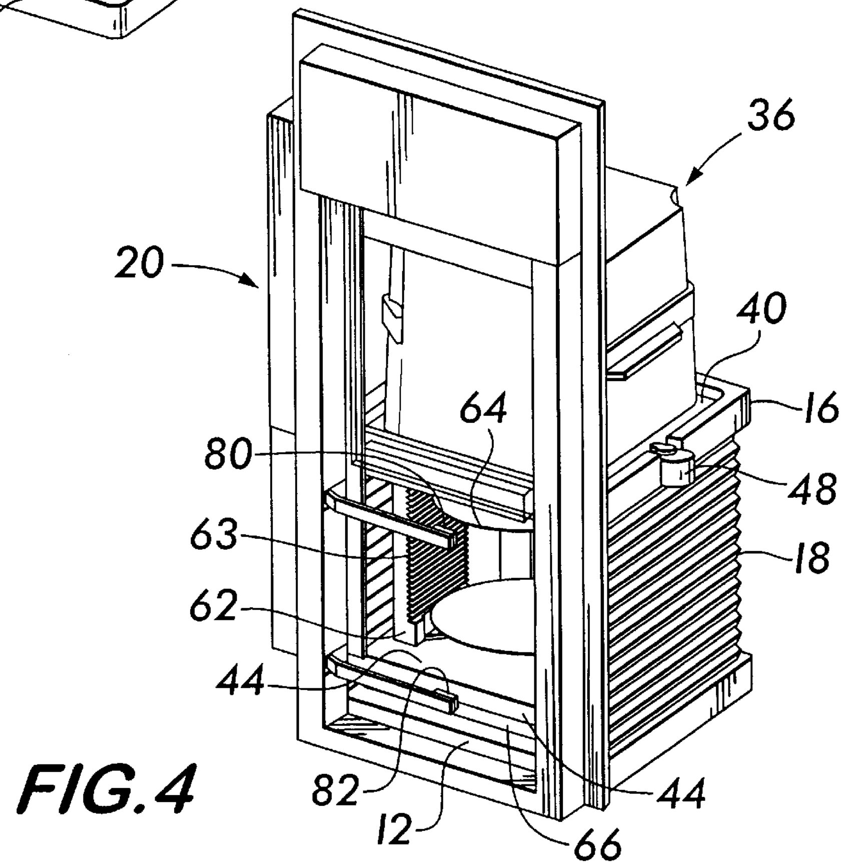
FIG. 4 is a one-quarter isometric view of an apparatus of the present invention with the apparatus in the open position.
Figure 7A:
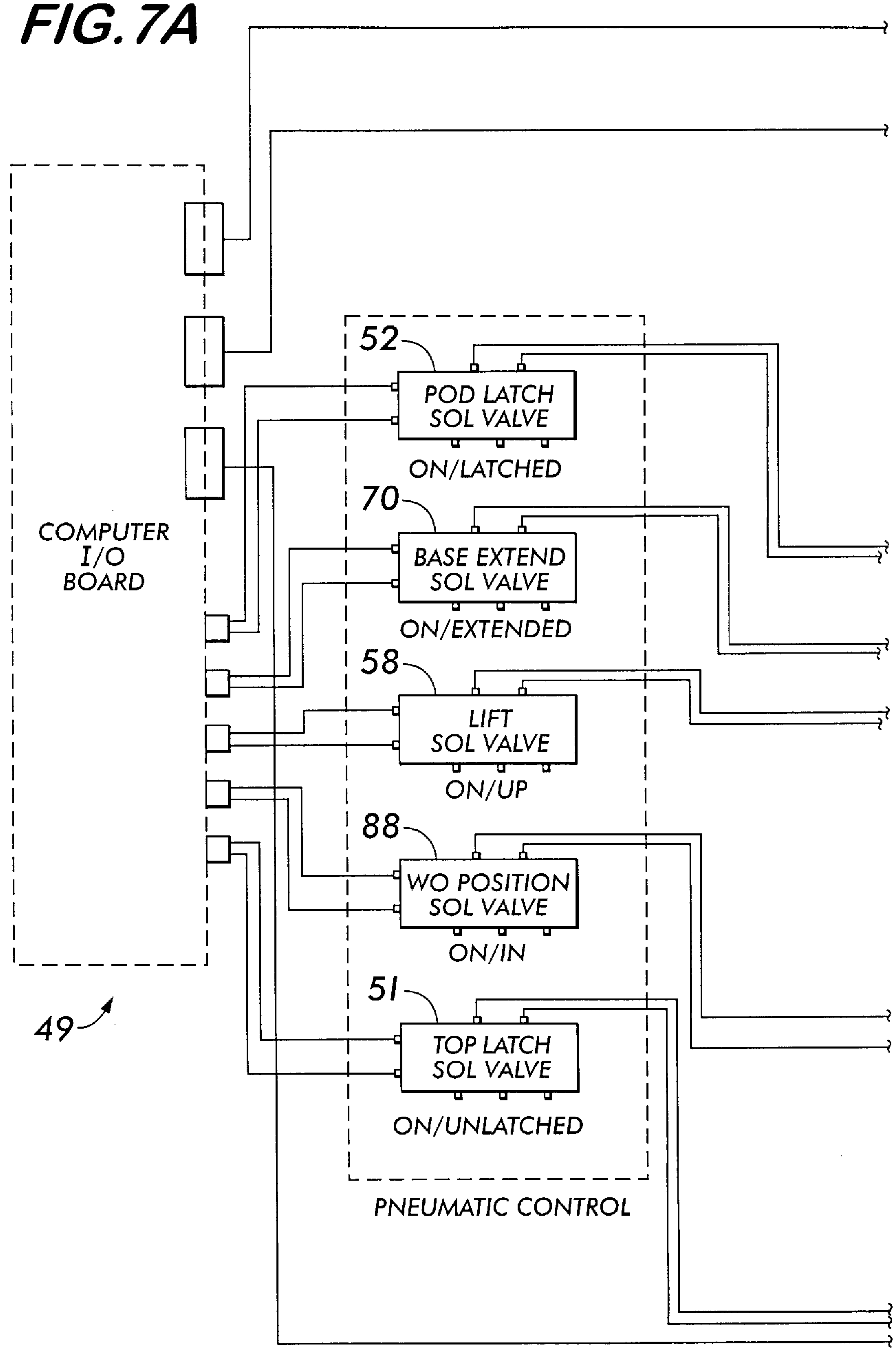
FIG. 7 is a control schematic of an apparatus of FIG. 1 showing the control elements.

With reference particularly to FIGS. 3, 4 and 7, lift ring 16 is raised by a lift cylinder 56 (FIG. 7) located within tower 20. Following signalling by pod unlatch switch 54 to the controller, lift solenoid valve 58 is energized to pressurize lift cylinder 56, lifting the top of a box comprising the sidewalls 38 and the top 42 relative to the box bottom with the flexible isolator means 18 expanding as ring 16 moves upwardly relative to base 12. Concurrently, closure door 26 which is interconnected with lift ring 16 by suitable fastening means is raised opening the port to the controlled environment within the work station enclosure. A lift top switch 60 signals controller 49 so that the lift tower is elevated and the closure door 26 is opened.

Preferably, bulkhead 22 and the closure door 26 are optically transparent to facilitate visual access into the controlled environment. At this point in the operation, a newly created volume housing the article formerly enclosed within the SMIF box is in open communication with the interior of the work station.

Figure 5:
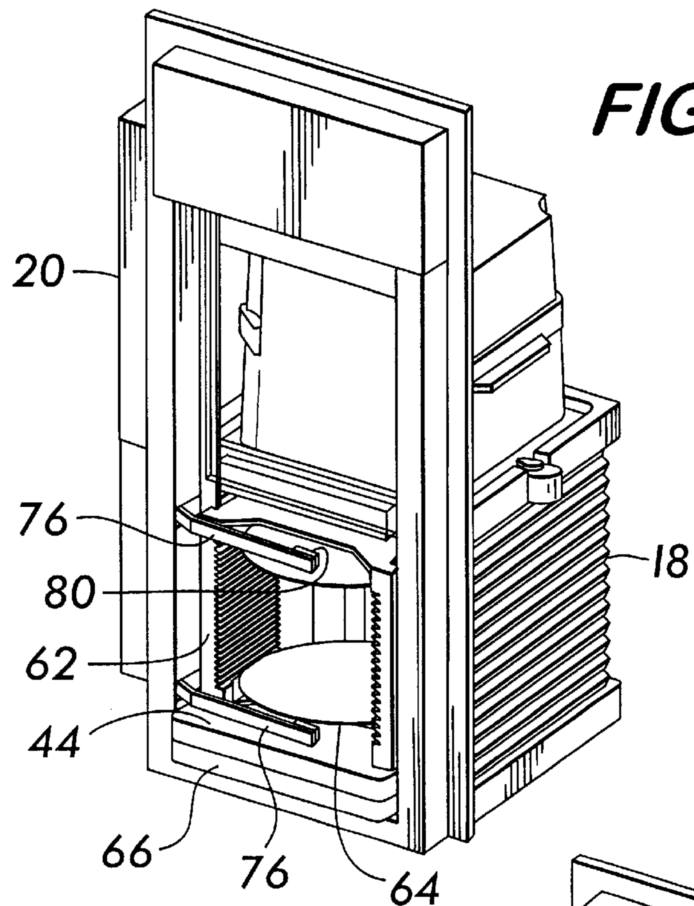
FIG. 5 is a one-quarter isometric view of an apparatus of FIGS. 1–4 with the apparatus in the open position and the cassette extended.
Figure 6:
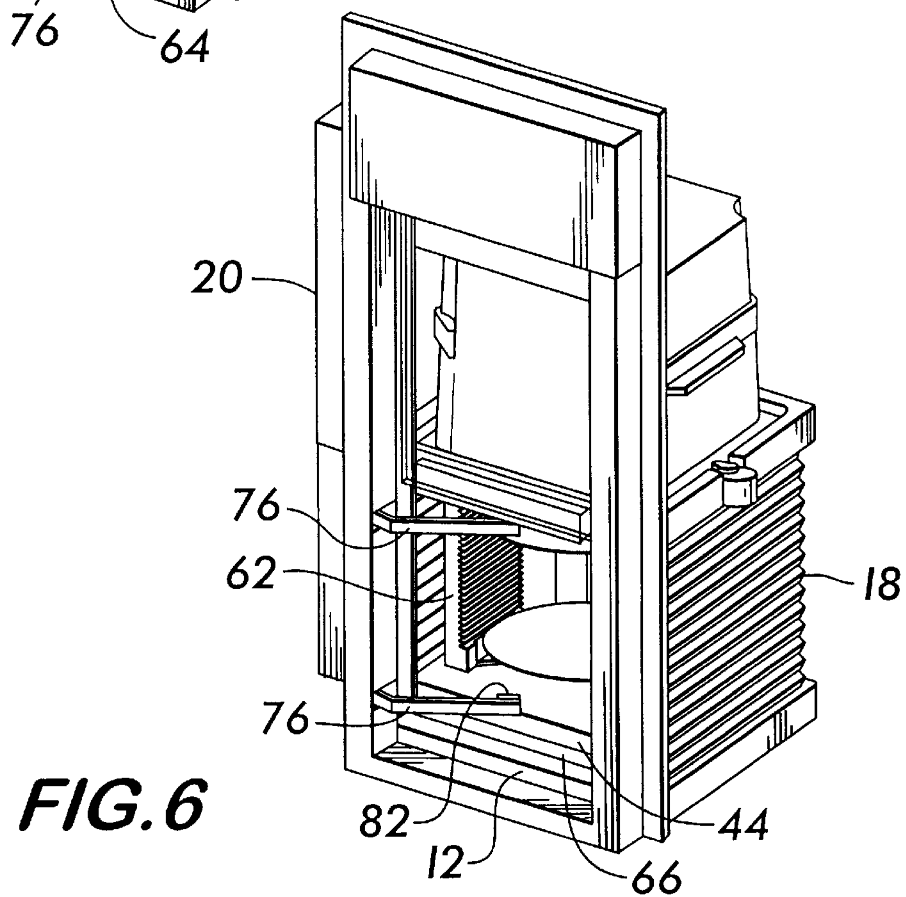
FIG. 6 is a one-quarter isometric view of an apparatus of FIG. 5 with the wafer out sensing mechanism in the read position.

FIGS. 4–6 show the apparatus with the lift ring 16 and the upper part of SMIF box 36 in the raised position with the article being accessible to the controlled environment within the work station. As illustrated in FIGS. 4–6, the article comprises a conventional cassette 62 having guide grooves 63 within which a multiplicity of silicon wafers 64 are mounted.

To facilitate access to the wafers by robotics equipment within the controlled environment of the work station, an upper, extendable base 66 is mounted on base 12 for sliding movement into and out of the work station on bearings, as shown in FIG. 2*a*. A base extender cylinder 68 having a piston rod 68*a* attached to base extender 66 (FIG. 7) controlled by a base extender solenoid valve 70 is actuated following a signal to the controller by lift top switch 60 to move the base extender 66 relatively to the base so that the cassette and the wafers are extended towards the controlled environment. The base extender is preferably mounted on linear bearings, as shown at 71 in FIG. 2*a*, to facilitate motion in and out of the work station controlled environment. A suitably placed limit switch 72 provides a signal to the controller indicating that the base is extended and that the wafers are available for processing.

During processing, the wafers are individually removed from the cassette, processed as required and then returned. Upon completion of processing, the host tool or the operator signals the controller that the operation is completed so that the interface may be closed in preparation for removal of the box with the processed wafers properly protected.

The closing process is, in most respects, the reverse of the opening process. Either the toggle 35 is moved to the closed position by an operator or by a signal generated by the host tool signalling the controller 49 to close the SMIF box.

Where a base extender is provided, operation of switch 35 or the signal from the host tool switches solenoid valve 70 to the position in which the base extender cylinder retracts, moving the base and base extender back through the open door. A suitably placed retraction switch 74 signals the controller that the base has been retracted.

The apparatus further includes sensing means for sensing that no wafers are out of position within the cassette. A suitable wafer sensing means comprises a pivotally mounted mounting bracket having a pair of arms. Bracket 76 is rotatably operated by a rotary actuator 78, shown in FIG. 7. As shown in FIG. 7, one of the brackets 76 carries a light sensor 80 and the other carries a light emitter 82. A pair of limit switches 84, 86 are provided to control movement of brackets 76 from a retracted position, illustrated in FIGS. 4 and 5, to a position in which the light path between the emitter and the sensor will be interrupted by any mispositioned wafer projecting outwardly so that it might be damaged upon closure of door 26 or by lowering of box top 36. Interruption of the light path signals the controller to report an error interrupting the closing operation until the mispositioned wafer and/or cassette is fully retracted. If no wafers are out of position, or those mispositioned have been properly positioned, solenoid operated valve 88 actuates the rotary actuator to move brackets 76 to the retracted position. This position is confirmed by switch 86 which signals controller 49 that lift cylinder 56 may lower tower 20.

Lift cylinder solenoid valve 58 is energized by the controller and switched to the position allowing lift cylinder 56 to lower the lift ring 16. Collapsing flexible bellows 18 then contracts and the upper portion of SMIF box 36 fits onto it base, enclosing the filled cassette. A lift bottom switch 90 signals return of the tower to its lowered position to the controller.

At the bottom of the lift cylinder stroke, the base of the SMIF box is in position to be latched to the top. Pod latch solenoid valve 52 reverses the direction of rotation of rotary actuator 53 rotating pins 32*a*, 32*b*, thereby closing the latches internal of the box locking the base to the top. Completion of latching of the box is signalled by closure of the pod latch switch 54*a*. Top latch solenoid valve 51 is then activated by the controller and switched to the position in which the top latch rotary actuators rotate the top latches 48 to a position in which the SMIF box 36 may be removed.

We claim:

1. Apparatus for the transfer of articles to be processed between a transport container and a controlled environment work station, said container having a top and a separate bottom on which articles to be processed are supported and a latching mechanism for latching the top to the bottom, said apparatus comprising:

- a base for support of the bottom of the transport container;
- a container unlatching means mounted in the base interengagable with the latching mechanism when the bottom is supported on the base for unlatching the container bottom from the top;
- a lift plate above the base;
- top latch means for connecting the lift plate to the container top;
- lift plate elevating means for moving said lift plate relatively to the base between a bottom position wherein said container top and bottom are together and a top position wherein said top and bottom are separated and a clearance space is established allowing for lateral movement of articles to and from the base;
- an expandable barrier means sealably attached to said lift plate and to said base, said barrier means allowing for relative vertical movement of the lift plate and the base and forming an isolation chamber between the lift plate and base when the lift plate is in said separated position;
- interface means associated with said flexible barrier defining an access opening for access to articles supported on said base; and
- a door covering said access opening, means for opening said door upon movement of the lift plate to said top position.

2. Apparatus according to claim 1, wherein said expandable barrier means comprises a flexible bellows.

3. Apparatus according to claim 1, wherein said interface means includes means for interfacing said door with said work station controlled environment.

4. Apparatus according to claim 3, wherein said expandable barrier means includes side edge portions interengagable with said interface means upon relative movement of the lift plate to and from the top position for sealing the isolation chamber from the ambient.

5. Apparatus according to claim 4, wherein said lift plate comprises an open frame dimensioned to fit around the periphery of said container top.

6. Apparatus according to claim 5, wherein said top latch means connects the container top to the bottom adjacent the container bottom.

7. Apparatus according to claim 6, wherein said base includes a stationary support and a slidable plate mounted on said stationary support for support of said container bottom and means for moving said slidable plate through said access opening when the door is open.

8. Apparatus according to claim 7, further including sensing means for sensing the presence of mispositioned articles placed on said container bottom prior to return of said lift plate to said bottom position.

9. Apparatus according to claim 8, further including control means for blocking movement of said lift plate to the bottom position upon the sensing by said sensing means of mispositioned articles on said container bottom.

10. Apparatus according to claim 9, wherein said articles are silicon wafers and said apparatus further comprises a wafer cassette having vertically spaced support grooves for support of stacked wafers within said chamber.

11. Apparatus according to claim 3, wherein said interface means comprises a planar panel surrounding said access opening and wherein said door is slidably mounted for vertical movement relatively to said access opening.

12. Apparatus according to claim 1, wherein said apparatus further includes a first sensing means in said base for sensing the presence on said base of the bottom on said container, control means for operating said latching mechanism to unlatch the container bottom from the top when the sensing means senses the presence of the container bottom and for actuating said container top latch for connecting the lift plate to the top;

- said control means thereafter operating said lift plate elevating means for moving said lift plate to said top position.

13. Apparatus according to claim 12, further including means operable prior to return of said lift plate to said bottom position for sensing the presence of mispositioned articles on said container bottom, wherein said control means blocks return of said lift plate until said articles are positioned out of the path of movement of said door.

14. Apparatus according to claim 13, wherein said articles comprise silicon wafers and a cassette for support of said wafers in a vertically oriented stack on said container bottom, said cassette maintaining said wafers in spaced apart relationship.

15. Apparatus for transfer of silicon wafers and like particles from a portable SMIF box to a controlled environment work station, wherein said SMIF box comprises a top and a separable bottom on which said wafers to be processed are spaced apart in a vertically oriented stack, said SMIF box further having a latching mechanism for latching the SMIF box top to its bottom, said transfer apparatus comprising:

- a base for support of the bottom of the SMIF box;

a SMIF box unlatching means in said base, said unlatching means being interengagable with the latching mechanism in the SMIF box bottom when the bottom is supported on the base for unlatching the SMIF box bottom from the top;

a lift ring above the base, said lift ring being dimensioned to fit in close proximity to the perimeter of the SMIF box top;

top latch means for connecting the lift ring to the container top;

lift ring elevating means for moving said lift ring between a lowered position wherein said SMIF box top is supported on the bottom and an elevated position in which clearance for lateral movement of wafers from said stack is established;

an expandable barrier sealably interconnecting said lift ring plate and said base, said barrier allowing for selective vertical movement of the lift ring and the base and forming an isolation chamber extending from the base to the lift ring when the lift ring is in said elevated position;

interface means cooperating with said barrier for defining an access opening communicating with the controlled environment of said work station; and a door covering said access opening means associated with said lift ring for opening said door when the lift ring is in said elevated position and for closing said door upon movement of the lift ring to said lowered position.

16. Apparatus according to claim 15, including control means for blocking movement of said lift ring to the lowered position upon detection of wafers mispositioned in the path of movement of the door to the closed position.

17. Apparatus according to claim 15, wherein said expandable barrier comprises a flexible bellows.

* * * * *